United States Patent
Tasher

(10) Patent No.: US 9,397,666 B2
(45) Date of Patent: Jul. 19, 2016

(54) FAULT PROTECTION FOR CLOCK TREE CIRCUITRY

(71) Applicant: Winbond Electronics Corporation, Zhubei (TW)

(72) Inventor: Nir Tasher, Tel Mond (IL)

(73) Assignee: WINBOND ELECTRONICS CORPORATION, Taichung (TW)

( * ) Notice: Subject to any disclaimer, the term of this patent is extended or adjusted under 35 U.S.C. 154(b) by 153 days.

(21) Appl. No.: 14/337,257

(22) Filed: Jul. 22, 2014

(65) Prior Publication Data

US 2016/0028381 A1  Jan. 28, 2016

(51) Int. Cl.
*G06F 1/04* (2006.01)
*H03K 19/177* (2006.01)
*G06F 1/10* (2006.01)

(52) U.S. Cl.
CPC ............ *H03K 19/17768* (2013.01); *G06F 1/10* (2013.01)

(58) Field of Classification Search
CPC ............................. H03K 3/0375; H03K 3/012
USPC ........................................................ 327/292
See application file for complete search history.

(56) References Cited

U.S. PATENT DOCUMENTS

| 4,860,288 | A | 8/1989 | Teske et al. |
| 5,867,409 | A | 2/1999 | Nozuyama |
| 6,735,732 | B2 | 5/2004 | Yamada |
| 6,844,761 | B2 | 1/2005 | Byun et al. |
| 7,372,304 | B2 | 5/2008 | Fruhauf et al. |
| 7,702,992 | B2 | 4/2010 | Ogawa |
| 7,770,049 | B1 | 8/2010 | Searles et al. |
| 8,542,177 | B2 | 9/2013 | Lee |

(Continued)

FOREIGN PATENT DOCUMENTS

| CN | 101192820 A | 6/2010 |
| KR | 101352149 B1 | 1/2014 |

OTHER PUBLICATIONS

U.S. Appl. No. 14/308,723 Office Action dated Jun. 4, 2015.

(Continued)

*Primary Examiner* — Ryan Jager
(74) *Attorney, Agent, or Firm* — D. Kligler IP Services Ltd.

(57) ABSTRACT

An Integrated Circuit (IC) includes clock-tree circuitry and protection circuitry. The clock-tree circuitry is configured to distribute a clock signal across the IC. The protection circuitry is clocked by multiple instances of the clock signal that are sampled at multiple sampling points in the clock-tree circuitry, and is configured to detect a fault in the clock-tree circuitry in response to an abnormality in one or more of the instances of the clock signal.

10 Claims, 2 Drawing Sheets

(56) References Cited

U.S. PATENT DOCUMENTS

| | | |
|---|---|---|
| 2005/0235179 A1 | 10/2005 | Pistoulet |
| 2007/0075746 A1* | 4/2007 | Fruhauf ............ G01R 31/31719 326/93 |
| 2008/0284483 A1 | 11/2008 | Nakashima |
| 2009/0315603 A1 | 12/2009 | Bancel et al. |
| 2011/0029828 A1 | 2/2011 | Bancel et al. |
| 2011/0234307 A1 | 9/2011 | Marinet et al. |
| 2013/0099844 A1* | 4/2013 | Kawaoka ................. G06F 1/06 327/293 |
| 2013/0113572 A1 | 5/2013 | Sharda et al. |
| 2013/0305078 A1 | 11/2013 | Lee et al. |
| 2014/0075255 A1 | 3/2014 | Lee et al. |
| 2014/0219406 A1 | 8/2014 | Chen et al. |
| 2015/0121327 A1* | 4/2015 | Kamal .................... G06F 1/10 716/113 |
| 2015/0269298 A1* | 9/2015 | Dai ..................... G06F 17/5045 716/134 |
| 2015/0280722 A1* | 10/2015 | Liu ......................... H03L 7/087 327/158 |
| 2015/0323959 A1* | 11/2015 | Arabi ...................... G06F 1/10 327/270 |
| 2015/0369865 A1 | 12/2015 | Hershman et al. |

OTHER PUBLICATIONS

Hershman et al., U.S. Appl. No. 14/507,867, filed Oct. 7, 2014.
U.S. Appl. No. 14/752,944 Office Action dated Mar. 16, 2016.
U.S. Appl. No. 14/752,944 Office Action dated Dec. 9, 2015.
European Application No. 14/79703.5 Search Report dated Feb. 13, 2015.
TW Application No. 103140005 Office Action dated Nov. 25, 2015.

* cited by examiner

FAULT PROTECTION FOR CLOCK TREE CIRCUITRY

FIELD OF THE INVENTION

The present invention relates generally to digital electronic circuitry, and particularly to methods and systems for protection from faults in clock tree circuitry.

BACKGROUND OF THE INVENTION

Various technique are used for accessing, analyzing or extracting information from secure electronic circuitry, such as cryptographic circuitry. Some attacks, referred to as fault injection, typically involve causing a fault in the circuit, e.g., by physically contacting or damaging signal lines, by applying high-power laser or electromagnetic pulses, or by causing glitches on power supply or other external interfaces. The fault is expected to cause the circuit to output sensitive information, or otherwise assist the attacker in penetrating the circuit or the information it stores.

SUMMARY OF THE INVENTION

An embodiment of the present invention that is described herein provides an Integrated Circuit (IC) including clock-tree circuitry and protection circuitry. The clock-tree circuitry is configured to distribute a clock signal across the IC. The protection circuitry is clocked by multiple instances of the clock signal that are sampled at multiple sampling points in the clock-tree circuitry, and is configured to detect a fault in the clock-tree circuitry in response to an abnormality in one or more of the instances of the clock signal.

In some embodiments, the protection circuitry includes a cascade of logic stages that are clocked by the respective instances of the clock signal, and a detector that is configured to detect the fault by identifying in an output of the cascade a deviation from an expected output. In an embodiment, the logic stages include respective Flip-Flops (FFs). In a disclosed embodiment, the cascade of logic stages is configured to output an alternating pattern of logical values, and the detector is configured to identify the deviation from the alternating pattern.

In an embodiment, the detector is configured to disregard deviations in the output of the cascade that occur within a predefined interval after initialization. In an alternative embodiment, the protection circuitry is configured to initialize the logic stages of the cascade so as to initially produce the expected output. In some embodiments, in response to detecting the fault, the protection circuitry may be configured to issue an alert or act upon the detected fault.

There is additionally provided, in accordance with an embodiment of the present invention, a method including distributing a clock signal across an Integrated Circuit (IC) using clock-tree circuitry. Multiple instances of the clock signal are sampled at multiple respective sampling points in the clock-tree circuitry. Protection circuitry is clocked by the multiple instances of the clock signal. A fault in the clock-tree circuitry is detected, using the protection circuitry, in response to an abnormality in one or more of the instances of the clock signal.

The present invention will be more fully understood from the following detailed description of the embodiments thereof, taken together with the drawings in which:

DETAILED DESCRIPTION OF EMBODIMENTS

Overview

Embodiments that are described herein provide improved methods and systems for detecting faults in Integrated Circuit (IC) clock-tree circuitry. In the disclosed embodiments, an IC comprises clock-tree circuitry (also referred to as "clock tree" for brevity) that distributes a clock signal from a clock source to various hardware units across the IC. The clock-tree circuitry typically comprises circuit traces that span large portions of the IC, as well as active components such as amplifiers, buffers, latches and/or inverters.

In some cases, the clock tree may be subject to fault attacks that attempt to analyze the IC functionality or gain access to information stored in the IC, for example. A fault attack typically applies some constant or temporary abnormality in the clock tree, in an attempt to force the IC into an abnormal state that evades its protection mechanisms. Although the description that follows focuses on fault attacks, the disclosed techniques can also be used for detecting faults that are not caused by attacks.

In some embodiments, the IC comprises protection circuitry that detects, alerts and possibly acts upon fault attacks on the clock tree. The protection circuitry is clocked by multiple instances of the clock signal, which are sampled at multiple sampling points on the clock tree, and identifies a fault in the clock tree by detecting an abnormality in one or more of the clock signal instances.

In an example embodiment, the protection circuitry comprises a cascade of Flip-Flop (FF) stages whose clock inputs are clocked by the respective instances of the clock signal. The first FF stage has its negated output fed-back to its input. Under normal conditions, the output of the cascade is an alternating "1010101010 . . ." pattern. Any deviation from this pattern indicates an abnormality in one or more of the clock inputs of the FF stages, i.e., in one or more of the sampled instances of the clock signal. The processing circuitry comprises a detector, which detects faults in the clock tree by identifying deviations from the expected "101010 . . ." pattern at the cascade output. In alternative embodiments, other suitable patterns (e.g., a pseudo-random yet predictable pattern) can also be used.

The disclosed technique is highly effective and sensitive in detecting various kinds of fault attacks on the clock-tree circuitry. At the same time, the protection circuitry is small and simple to implement.

System Description

Figure 1:
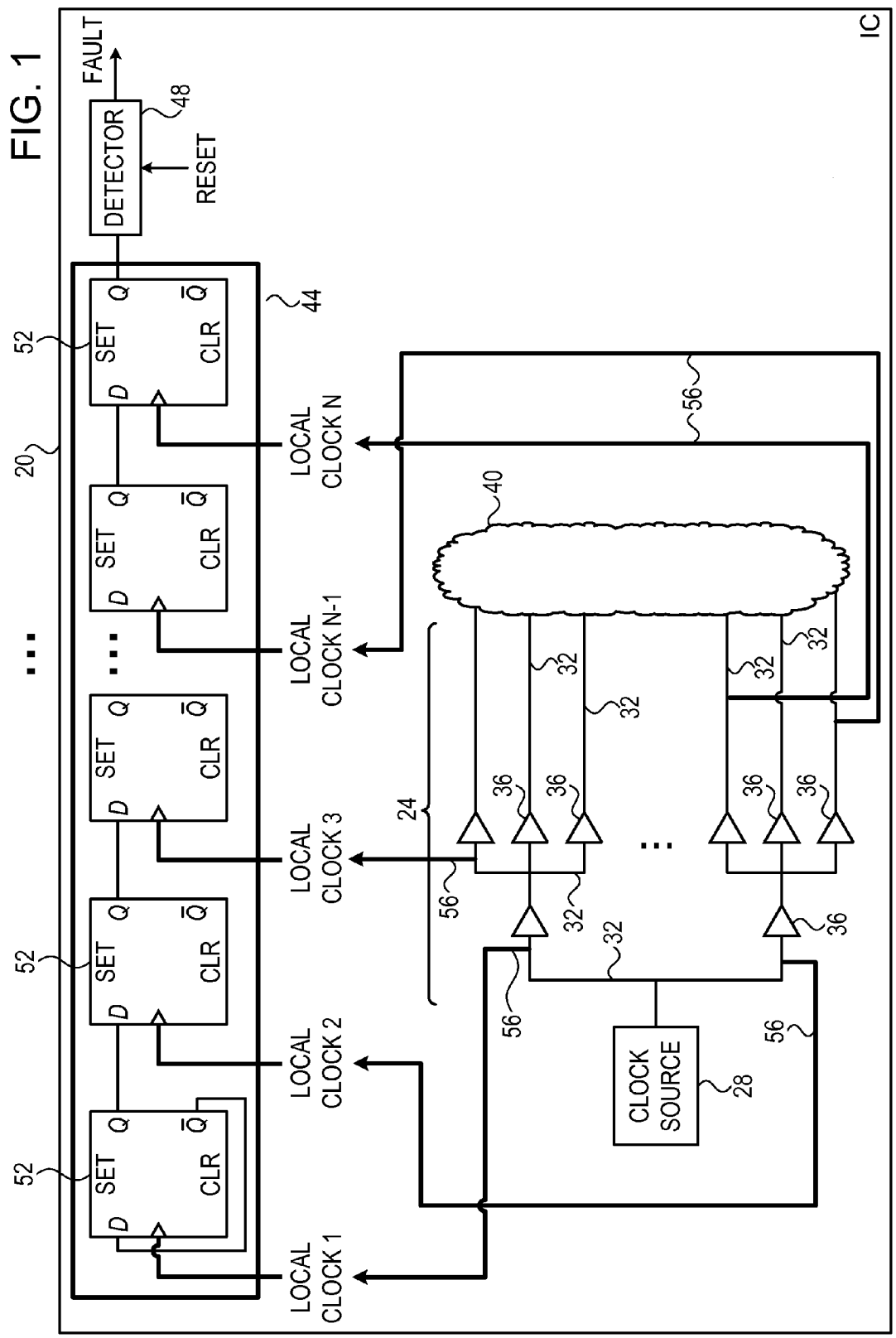
FIG. 1 is a block diagram that schematically illustrates an Integrated Circuit (IC) comprising clock-tree protection circuitry, in accordance with an embodiment of the present invention.

FIG. 1 is a block diagram that schematically illustrates an Integrated Circuit (IC) 20 comprising clock-tree protection circuitry, in accordance with an embodiment of the present invention. IC 20 may comprise, for example, a microprocessor, a memory device, a custom Application-Specific IC (ASIC), a Field-Programmable Gate Array (FPGA) or any other suitable type of IC.

IC 20 comprises a clock tree 24, which distributes a clock signal from a clock source 28 to functional hardware 40 across the IC. Clock tree 24 comprises conductive traces 32, as well as active components 36 such as amplifiers, buffers, latches and/or inverters. Hardware 40 may comprise any suitable number and types of functional units, which are distributed over the area of IC 20 as desired. As such, clock tree 24 may span large portions of the IC area, or even the entire IC.

The beginning of the clock tree, at the clock source, is referred to as a root. From the root toward the functional hardware, the clock-tree circuitry splits into multiple branches. The edges of the branches, which drive the functional hardware, are referred to as leaves.

The example of FIG. 1 refers to a single clock signal and a single clock tree, for the sake of clarity. Real-life ICs often contain multiple clock trees that distribute multiple clock signals. The disclosed techniques are similarly applicable in such ICs, as well.

Clock-Tree Fault Protection

In some embodiments, IC 20 further comprises protection circuitry for detecting faults in the clock tree, such as faults caused by hostile fault attacks. Such an attack may comprise, for example, cutting the clock tree at one or more points, injecting a voltage glitch at some point or points on the clock tree, forcing a fixed voltage or ground at some point or points on the clock tree, or any other kind of manipulation or abnormality.

In the present example, the protection circuitry of IC 20 comprises a shift register 44, which comprises multiple cascaded Flip-Flop (FF) stages 52, and a detector 48. Multiple sampling lines 56 extract multiple instances of the clock signal from multiple respective sampling points across clock tree 24. The multiple instances of the clock signal are routed to shift register 44 and drive respective clock inputs of FF stages 52. The number of FF stages, and the number of clock-signal instances, is denoted N.

In other words, each FF stage 52 is clocked by a respective instance of the clock signal, which is extracted from a respective sampling point on clock tree 24. Instances of the clock signal may be sampled at the root, at the leaves, or at any intermediate branch of the clock tree. The number and locations of the sampling points may be chosen as desired, for example at random or to protect specific hardware units or functions in the IC.

The first FF stage in the shift register (the left-most stage in the figure) has its negated ($\overline{Q}$) output fed-back to its input (D). The output (Q) of each FF stage drives the input (D) of the next stage, and the output of the last FF stage serves as output of the cascade.

Under normal steady-state conditions, the signal at the output of the cascade alternates between "1" and "0" at the rate of the clock signal. Steady-state conditions are typically reached N clock cycles after reset or initialization, since the initial states of the FF stages are unpredictable, and N cycles are needed for the alternating "1010101010 . . . " pattern to propagate to the output. In an alternative embodiment, the initial states of FF stages 52 can be set at system initialization to known values that already correspond to the expected pattern. In the present example, even-order FF stages may be reset to logic '0' and odd-order FF stages may be reset to logic '1'.

If a fault occurs at some point or points in the clock tree, e.g., as a result of an attack, one or more of the clock signal instances will exhibit some abnormality. For example, one or more clock signal instances may be shut-off (possibly indicating that the clock tree was cut), one or more clock signal instances may be stuck at some fixed voltage or ground, or a transient glitch may be found on one or more clock signal instances. Alternatively, any other suitable abnormality may show on one or more clock signal instances.

An abnormality in a given instance of the clock signal causes abnormality in clocking the respective FF stage 52 in the protection circuitry. As a result, the output of shift register 44 will deviate from the expected "10101010 . . . " pattern.

In some embodiments, detector 48 monitors the output of shift register 44 and checks for deviations from the expected "10101010 . . . " pattern. The detector is typically also provided with the IC reset signal, in order to disregard the initial interval of N cycles after reset or initialization, during which the shift register output legitimately deviates from the expected pattern.

In response to detecting a deviation from the expected pattern, detector 48 typically triggers a fault alert. The IC protection circuitry may take various actions in response to a fault alert, such as shut down portions of the IC, erase certain data from the IC, issue an external alert, or any other suitable action.

The configurations of IC 20, and in particular the protection circuitry, shown in FIG. 1 are example configurations that are depicted purely for the sake of conceptual clarity. In alternative embodiments, any other suitable IC and/or protection circuitry configuration can be used. For example, the protection circuitry may comprise any other suitable circuit that is clocked by the multiple instances of the clock signal, and whose output is indicative of the presence or absence of faults in the clock tree. Depending on the specific design of the protection circuitry, the expected pattern may have any other suitable format. For example, the pattern may comprise a pseudo-random yet predictable pattern.

Figure 2:
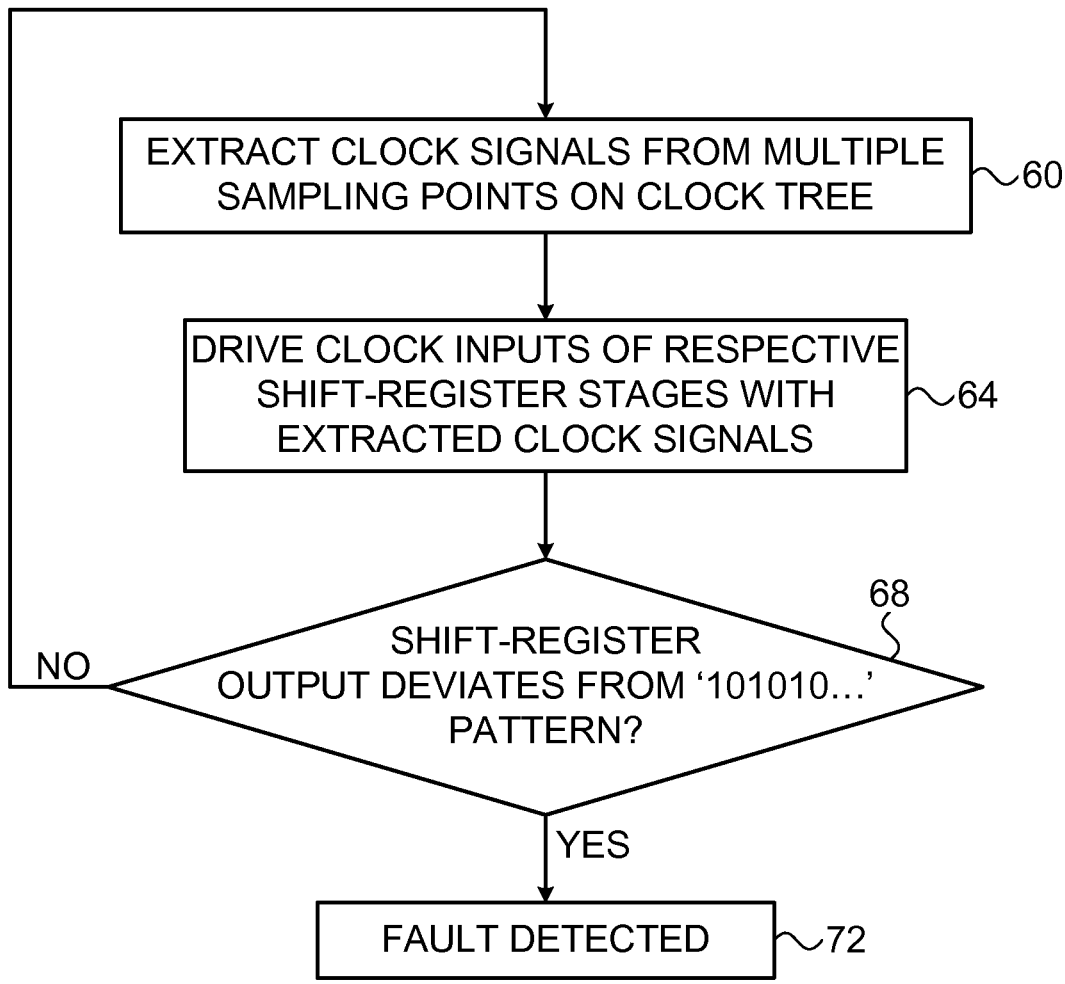
FIG. 2 is a flow chart that schematically illustrates a method for clock-tree fault protection, in accordance with an embodiment of the present invention.

FIG. 2 is a flow chart that schematically illustrates a method for clock-tree fault protection, in accordance with an embodiment of the present invention. The method begins with extracting multiple clock signal instances from multiple sampling points on clock tree 24, at a clock sampling step 60. The extracted clock signal instances drive the clock inputs of respective FF stages 52 of shift register 44, at a clocking step 64.

Detector 48 checks whether the output of shift register 44 deviates from the expected "10101010 . . . " pattern, at a checking step 68. If not, the method loops back to step 60 above. If a deviation is found, detector 48 issues a fault alert, at a fault detection step 72.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An Integrated Circuit (IC), comprising:
   clock-tree circuitry, which is configured to distribute a clock signal across the IC; and protection circuitry, comprising:
- a shift register, comprising multiple logic stages that are clocked by multiple instances of the clock signal sampled at multiple sampling points in the clock-tree circuitry and
- a detector, configured to detect a fault in the clock-tree circuitry caused by an abnormality in one or more of the instances of the clock signal, by detecting a deviation from an expected output of the shift register while disregarding, based on a provided reset signal, deviations from the expected output that occur within a predefined number of clock cycles after initialization or reset.

2. The IC according to claim 1, wherein the logic stages comprise respective Flip-Flops (FFs).

3. The IC according to claim 1, wherein the shift register is configured to output an alternating pattern of logical values, and wherein the detector is configured to identify the deviation from the alternating pattern.

4. The IC according to claim 1, wherein the protection circuitry is configured to initialize the shift register so as to initially produce the expected output.

5. The IC according to claim 1, wherein, in response to detecting the fault, the protection circuitry is configured to issue an alert or act upon the detected fault.

6. A method, comprising:
- distributing a clock signal across an Integrated Circuit (IC) using clock-tree circuitry;
- sampling multiple instances of the clock signal at multiple respective sampling points in the clock-tree circuitry;
- clocking multiple logic stages of a shift register by the multiple instances of the clock signal; and
- using a detector that monitors an output of the shift register, detecting a fault in the clock-tree circuitry caused by an abnormality in one or more of the instances of the clock signal, by detecting a deviation from an expected output of the shift register while disregarding, based on a provided reset signal, deviations from the expected output that occur within a predefined number of clock cycles after initialization or reset.

7. The method according to claim 6, wherein the logic stages comprise respective Flip-Flops (FFs).

8. The method according to claim 6, wherein clocking the logic stages comprises outputting an alternating pattern of logical values, and wherein detecting the fault comprises identifying the deviation from the alternating pattern.

9. The method according to claim 6, wherein identifying the deviation comprises initializing the shift register so as to initially produce the expected output.

10. The method according to claim 6, and comprising, in response to detecting the fault, issuing an alert or acting upon the detected fault.

* * * * *